United States Patent
Tsao et al.

(10) Patent No.: US 7,105,379 B2
(45) Date of Patent: Sep. 12, 2006

(54) IMPLEMENTATION OF PROTECTION LAYER FOR BOND PAD PROTECTION

(75) Inventors: Pei-Haw Tsao, Taichung (TW); Jan-Her Horng, Hsinchu (TW); Cheng-Chung Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 139 days.

(21) Appl. No.: 10/833,991

(22) Filed: Apr. 28, 2004

(65) Prior Publication Data

US 2005/0245050 A1    Nov. 3, 2005

(51) Int. Cl.
*H01L 21/66* (2006.01)
*H01L 21/50* (2006.01)
*H01L 21/48* (2006.01)

(52) U.S. Cl. ............... 438/114; 438/14; 438/113; 438/15; 438/110; 257/48; 257/E21.521; 257/E21.522; 257/E21.523; 257/E21.531; 257/E21.524

(58) Field of Classification Search ............... None
See application file for complete search history.

(56) References Cited

U.S. PATENT DOCUMENTS

| 4,821,148 | A * | 4/1989 | Kobayashi et al. ......... 361/728 |
| 4,821,944 | A * | 4/1989 | Tsumura .................. 228/110.1 |
| 6,251,694 | B1 * | 6/2001 | Liu et al. ..................... 438/14 |
| 6,358,847 | B1 * | 3/2002 | Li et al. ..................... 438/687 |
| 6,579,734 | B1 * | 6/2003 | Aoki ............................ 438/15 |
| 6,933,614 | B1 * | 8/2005 | Lee et al. .................... 257/780 |

\* cited by examiner

*Primary Examiner*—Luan Thai
(74) *Attorney, Agent, or Firm*—Thomas, Kayden, Horstemeyer & Risley

(57) ABSTRACT

A method of protecting a bond pad during die-sawing comprising the following steps. A substrate having a bond pad formed thereover is provided. A bond pad protection layer is formed over the bond pad. The substrate is die-sawed and the bond pad protection layer is removed by heating.

33 Claims, 2 Drawing Sheets

IMPLEMENTATION OF PROTECTION LAYER FOR BOND PAD PROTECTION

BACKGROUND OF THE INVENTION

A probe mark is left on bond pads after chip probe (CP) sorting. This probe mark will be enlarged during the integrated circuit (IC) assembly wafer die-sawing due to a so-called "Galvanic effect," i.e. an electrochemical reaction on the bond pad during the die-sawing. This may: expose the bond pad under-layer which has a great impact on the subsequent wire bonding process; degrade the wire bond integrity; and lead to assembly yield loss.

This probe mark enlargement is especially so and more serious for the larger 12-inch wafers since longer die-sawing is required for the larger area of the 12 inch-wafer. To minimize this exacerbated problem for the larger 12-inch wafers conventionally, attempts are made to shorten the 12-inch wafer die-saw process time although sometimes this is not possible.

U.S. Pat. No. 6,335,224 B1 to Peterson et al. discloses protection of microelectronic devices during packaging.

U.S. Pat. No. 6,297,561 B1 to Liu et al. discloses a semiconductor chip.

U.S. Pat. No. 6,251,694 B1 to Liu et al. discloses a method of testing and packaging a semiconductor chip.

SUMMARY OF THE INVENTION

Accordingly, it is an object of one or more embodiments of the present invention to provide a method of protecting bond pads during die-sawing.

Other objects will appear hereinafter.

It has now been discovered that the above and other objects of the present invention may be accomplished in the following manner. Specifically, substrate having a bond pad formed thereover is provided. A bond pad protection layer is formed over the bond pad. The substrate is die-sawed and the bond pad protection layer is removed by heating.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Information Known to the Inventors—Not to be Considered Prior Art

The following is information known to the inventors and is not to necessarily be considered prior art for the purposes of the present invention.

Re the Galvanic effect, in the presence of a suitable electrolyte (moisture), corrosion will occur ($Al_2Cu$ as the cathode, Al an the anode). The corrosion of aluminum proceeds around the $Al_2Cu$ particles leading to the formation of pits until the $Al_2Cu$ particles become electrically isolated from the surrounding metal:

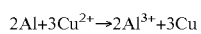

$$2Al + 3Cu^{2+} \rightarrow 2Al^{3+} + 3Cu$$

As the wafer is continually dipped in deionized water (DI), this galvanic cell reaction would continue to proceed. Eventually dredging the base of copper (Cu) nucleus and leave a hole in the pads.

Figure 1:
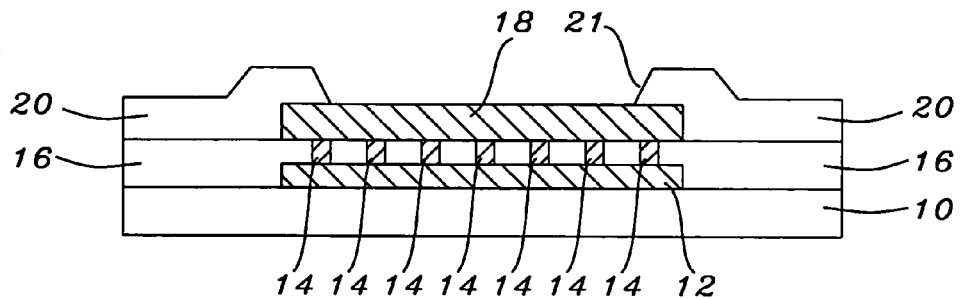
FIGS. 1 to 5 schematically illustrate a preferred embodiment of the present invention.

Initial Structure—FIG. 1

As shown in FIG. 1, a structure 10 has an uppermost conductive portion 12 formed thereover that is electrically connected to a bond pad 18 by conductive via structures 14 within a dielectric layer 16. A patterned passivation layer 20 is formed over the dielectric layer 16 and over the bond pad 18. Patterned passivation layer 20 includes an opening 21, exposing a portion of bond pad 18.

Structure 10 is preferably a silicon or germanium substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Uppermost conductive portion 12 is preferably comprised of copper, aluminum, or an aluminum-copper alloy and is more preferably aluminum.

Conductive via structures 14 are preferably comprised of copper or tungsten (W) and is more preferably tungsten.

Bond pad 18 is preferably comprised of copper or aluminum and is more preferably aluminum and has a thickness of preferably from about 0.5 to 2.0 µm.

Dielectric layer 16 is preferably comprised of silicon oxide.

Passivation layer 20 is preferably comprised of silicon oxide or silicon nitride and is more preferably silicon nitride.

Passivation layer opening 21 has a base width of preferably from about 40 to 100 µm and more preferably from about 40 to 60 µm.

Figure 2:
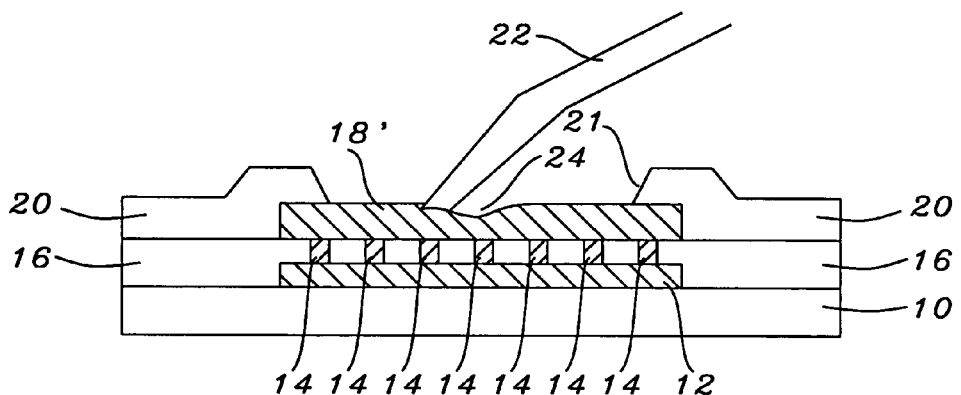

Probe 22 Positioning for Chip Probe Sorting—FIG. 2

As shown in FIG. 2, a probe 22 is positioned onto a portion of the bond pad 18 for chip probe sorting. After chip probe sorting, the bond pad 18 has a probe mark 24 formed on the upper portion of the bond pad 18 that is generally caused by the probe tip scratching the pad surface.

Figure 3:
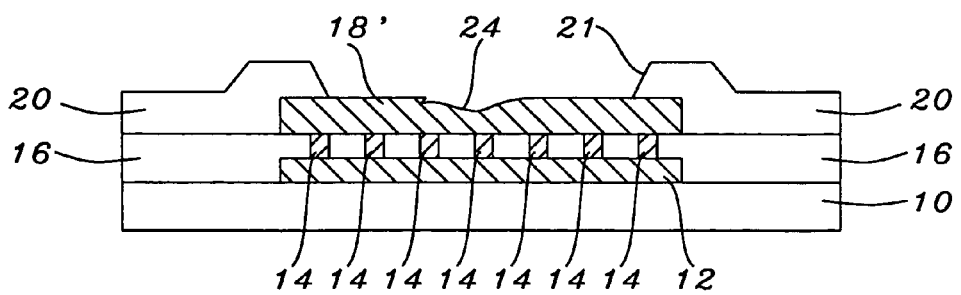

Probe Mark 24—FIG. 3

As shown in FIG. 3, probe 22 is removed after chip probe sorting leaving probe mark 24 which removes a portion of the bond pad 18 but does not expose the underlying conductive via structures 14 or the uppermost conductive portion 12.

Figure 4:
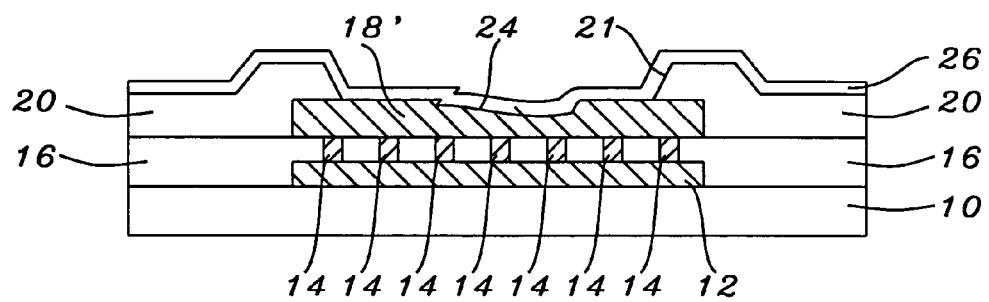

Formation of Bond Pad Protection Layer 26—FIG. 4

As shown in FIG. 4, the inventors have discovered that by forming an bond pad protection layer 26 over the probe marked bond pad 18' and the passivation layer 20, the probe mark 24 will not be enlarged due to the subsequent IC assembly die-sawing by the "Galvanic effect" (see above). The bond pad protection layer 26 is preferably comprised of an organic material (as will be used for illustrative purposes hereafter) and insulates the surface of the probe marked bond pad 18' and thus prevents the otherwise "Galvanic effect" enlargement of the probe mark 24.

The bond protection layer 26 is preferably organic so that it vaporizes upon heating (see below).

Organic bond pad protection layer 26 is preferably applied by a curtain-print, spread or spin-coat method and more preferably by a spin coat method.

Organic bond pad protection layer 26 is formed to a thickness of preferably from about 1000 to 50,000 Å and more preferably from about 10,000 to 20,000 Å and is preferably comprised of benzitriazoles or benzimidazoles and is more preferably benzimidazoles.

Figure 5:
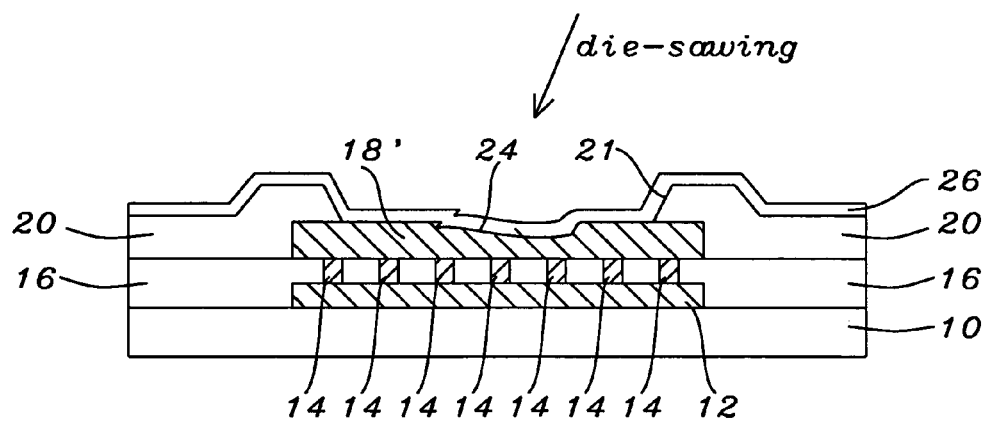

Post IC Assembly Wafer Die-Sawing—FIG. 5

FIG. 5 illustrates the structure of FIG. 4 after IC assembly wafer die-sawing and demonstrates that the probe mark 24 is not enlarged in the probe marked bond pad 18'.

The organic bond pad protection layer 26 will be vaporized during the subsequent die mount and epoxy cure process (high temperature, i.e. a temperature greater than about 175° C.) so that the wire bond process and wire bond integrity will not be impacted. Moreover, the assembly yield loss due to the probe mark 24 can be resolved and minimized.

While particular embodiments of the present invention have been illustrated and described, it is not intended to limit the invention, except as defined by the following claims.

We claim:

1. A method of protecting a bond pad during die-sawing, comprising the steps of:
    providing a substrate having a bond pad formed thereover;
    making a probe mark on the bond pad;
    forming a bond pad protection layer over the bond pad and the probe mark;
    die-sawing the substrate when the probe mark and the bond pad are completely covered by the bond pad protection layer, and
    removing the bond pad protection layer by heating.

2. The method of claim 1, wherein the substrate is a wafer.

3. The method of claim 1, wherein the substrate is comprised of silicon or germanium.

4. The method of claim 1, wherein the bond pad is comprised of copper or aluminum.

5. The method of claim 1, wherein the bond pad is comprised of aluminum.

6. The method of claim 1, wherein the bond pad protection layer is comprised of an organic material.

7. The method of claim 1, wherein the bond pad protection layer is comprised of benzitriazoles or benzimidazoles.

8. The method of claim 1, wherein the bond pad protection layer is comprised of benzimidazoles.

9. The method of claim 1, wherein the bond pad protection layer is formed by a curtain-print method, a spread method or spin-coat method.

10. The method of claim 1, wherein the bond pad protection layer is formed by a spin coat method.

11. The method of claim 1, wherein the bond pad protection layer has a thickness of from about 1000 to 50,000 Å.

12. The method of claim 1, wherein the bond pad protection layer has a thickness of from about 10,000 to 20,000 Å.

13. The method of claim 1, wherein the bond pad protection layer is volatile at a temperature about 175° C.

14. The method of claim 1, including the subsequent step of die mounting the substrate wherein the bond pad protection layer is vaporized during the die mounting.

15. The method of claim 1, including the step of forming a patterned passivation layer over the substrate and the bond pad before formation of the bond pad protection layer; the patterned passivation layer including an opening exposing a portion of the bond pad.

16. A method of protecting a bond pad during die-sawing, comprising the steps of:
    providing a substrate having a bond pad formed thereover; the bond pad having a probe mark;
    forming a bond pad protection layer over the bond pad and the probe mark; and
    die-sawing the substrate when the probe mark and the bond pad are completely covered by the bond pad protection layer whereby the bond pad protection layer retards enlargement of the probe mark during the die-sawing.

17. The method of claim 16, wherein the substrate is a wafer.

18. The method of claim 16, wherein the substrate is comprised of silicon or germanium.

19. The method of claim 16, wherein the bond pad is comprised of copper or aluminum.

20. The method of claim 16, wherein the bond pad is comprised of aluminum.

21. The method of claim 16, wherein the bond pad protection layer is comprised of an organic material.

22. The method of claim 16, wherein the bond pad protection layer is comprised of benzitriazoles or benzimidazoles.

23. The method of claim 16, wherein the bond pad protection layer is comprised of benzimidazoles.

24. The method of claim 16, wherein the bond pad protection layer is formed by a curtain-print method, a spread method or spin-coat method.

25. The method of claim 16, wherein the bond pad protection layer is formed by a spin coat method.

26. The method of claim 16, wherein the bond pad protection layer has a thickness of from about 1000 to 50,000 Å.

27. The method of claim 16, wherein the bond pad protection layer has a thickness of from about 10,000 to 20,000 Å.

28. The method of claim 16, wherein the bond pad protection layer is volatile at a temperature about 175° C.

29. The method of claim 16, including the subsequent step of die mounting the substrate wherein the bond pad protection layer is vaporized during the die mounting.

30. The method of claim 16, including the step of forming a patterned passivation layer over the substrate and the bond pad before formation of the bond pad protection layer; the patterned passivation layer including an opening exposing a portion of the bond pad.

31. The method of claim 16, wherein the probe mark is formed by attaching a probe to the bond pad.

32. The method of claim 16, whereby the bond pad protection layer prevents any enlargement of the probe mark during the die-sawing.

33. The method of claim 16, including the subsequent step of removing the bond pad protection layer by heating.

* * * * *